United States Patent [19]

Nieman et al.

[11] Patent Number: 4,600,262

[45] Date of Patent: Jul. 15, 1986

[54] ELECTRICAL CONNECTOR EMBODYING ELECTRICAL CIRCUIT COMPONENTS

[75] Inventors: Gerald R. Nieman; James E. Thompson, both of Phoenix; William D. Couper, Tempe; Clarence L. Clyatt, III, Phoenix, all of Ariz.

[73] Assignee: International Telephone & Telegraph Corp., New York, N.Y.

[21] Appl. No.: 480,169

[22] Filed: Mar. 29, 1983

[51] Int. Cl.[4] .......................... H03H 7/00; H01R 3/00

[52] U.S. Cl. ................................. 339/147 R; 333/182

[58] Field of Search ............. 339/14 R, 143 R, 147 R, 339/252 R, 252 P, 147 P; 333/182, 185

[56] References Cited

U.S. PATENT DOCUMENTS

| | | | |
|---|---|---|---|
| 2,390,706 | 12/1945 | Hearon | 339/252 P |
| 3,141,723 | 7/1964 | Bonhomme | 339/252 P |
| 3,200,355 | 8/1965 | Dahlen | 339/147 R |
| 3,462,715 | 8/1969 | Schor | 339/147 R |
| 3,569,915 | 3/1971 | Sorenson | 339/143 R |
| 3,721,869 | 3/1973 | Paoli | 333/79 |
| 3,766,516 | 10/1973 | Appleton | 339/252 P |
| 3,790,858 | 2/1974 | Brancaleone | 339/147 R |
| 3,854,107 | 12/1974 | Tuchto et al. | 333/183 |
| 4,079,343 | 3/1978 | Nijman | 339/147 R |
| 4,083,022 | 4/1978 | Nijman | 333/79 |
| 4,126,370 | 11/1978 | Nijman | 333/183 |
| 4,199,736 | 4/1980 | McTaggart et al. | 333/17 L |
| 4,376,922 | 3/1983 | Muzslay | 339/147 R |

*Primary Examiner*—Gil Weidenfeld
*Assistant Examiner*—Gary F. Paumen
*Attorney, Agent, or Firm*—T. L. Peterson; R. C. Turner

[57] ABSTRACT

An electrical connector containing removable contacts upon which there are mounted electrical circuit components. One or more such components may be mounted on the side of each contact body. A spring provides electrical connection between the components and the grounding plate in the connector containing openings into which the contacts are removably mounted.

24 Claims, 4 Drawing Figures

ELECTRICAL CONNECTOR EMBODYING ELECTRICAL CIRCUIT COMPONENTS

BACKGROUND OF THE INVENTION

The present invention relates generally to an electrical connector and, more particularly, to a connector in which contacts carrying electrical circuit components are individually removable from the connector insert.

U.S. Pat. No. 3,569,915 to Sorensen et al. discloses a filter connector in which filter contacts are mounted in openings in a metallic ground foil which makes electrical connection between the filters on the contacts and the shell of the connector. The filter element on the contact is of cylindrical form, and surrounds the contact body. Typically, the filter contact cannot be removed from the connector without disassembling the connector insert or insulator assembly.

U.S. Pat. No. 3,790,858 to Brancaleone et al. discloses an electrical connector in which electrical circuit components, such as magnetic pulse absorbers or radio frequency filter elements, are integrated into an electrical connector by mounting the same within a grounding plate in the shell of the connector spaced from the contacts which extend through openings in the plate. Conductors of the circuit components are connected to selected electrical contacts in the connector by means of a printed circuit board which is removably mounted in the shell of the connector. This arrangement requires disassembly of the entire connector in order to remove or replace the circuit components.

U.S. Pat. No. 3,462,715 to Schor and U.S. Pat. No. 4,126,370 to Nijman disclose filter connectors in which the contacts are slidably mounted within circular filter elements so that the contacts may be removed from the connector without disassembling the connector. However, disassembly of the connector is still required to remove the filter elements.

U.S. Pat. No. 3,200,355 to Dahlen and U.S. Pat. No. 3,854,107 to Tuchto et al. disclose filter connectors in which filter contacts are individually removable from the connector insert so that disassembly of the connector is not required to replace either the contacts or the filters. In each patent, the filter element is of cylindrical form, surrounding the contact body, and electrical connection between the filter element and the ground plane in the connector is provided by spring fingers integrally formed on or mounted within the ground plane.

It is the object of the present invention to provide an electrical connector containing electrical contacts carrying electrical circuit components, wherein not only are the contacts individually removable from the connector insert, but the connector has fewer parts, is smaller in size and is less complex and easier to assemble than the prior art filter connectors.

SUMMARY OF THE INVENTION

According to a principal aspect of the present invention, there is provided an electrical connector member in which one or more electrical circuit components are mounted on the side of each contact, rather than surrounding the contact body as in the prior art filter connectors. Preferably, the components are mounted in a notch formed in the contact body, and electrical connection is made between the components and the ground plate in the connector shell by means of a spring element mounted on the components. By this arrangement, the contacts may be individually removed from the connector insert for easy repair and replacement, and the contacts contain fewer parts and may be smaller in size for permitting a very high density arrangement of the contacts in the connector.

DESCRIPTION OF THE PREFERRED EMBODIMENTS

Figures 1, 2, 3, 4:
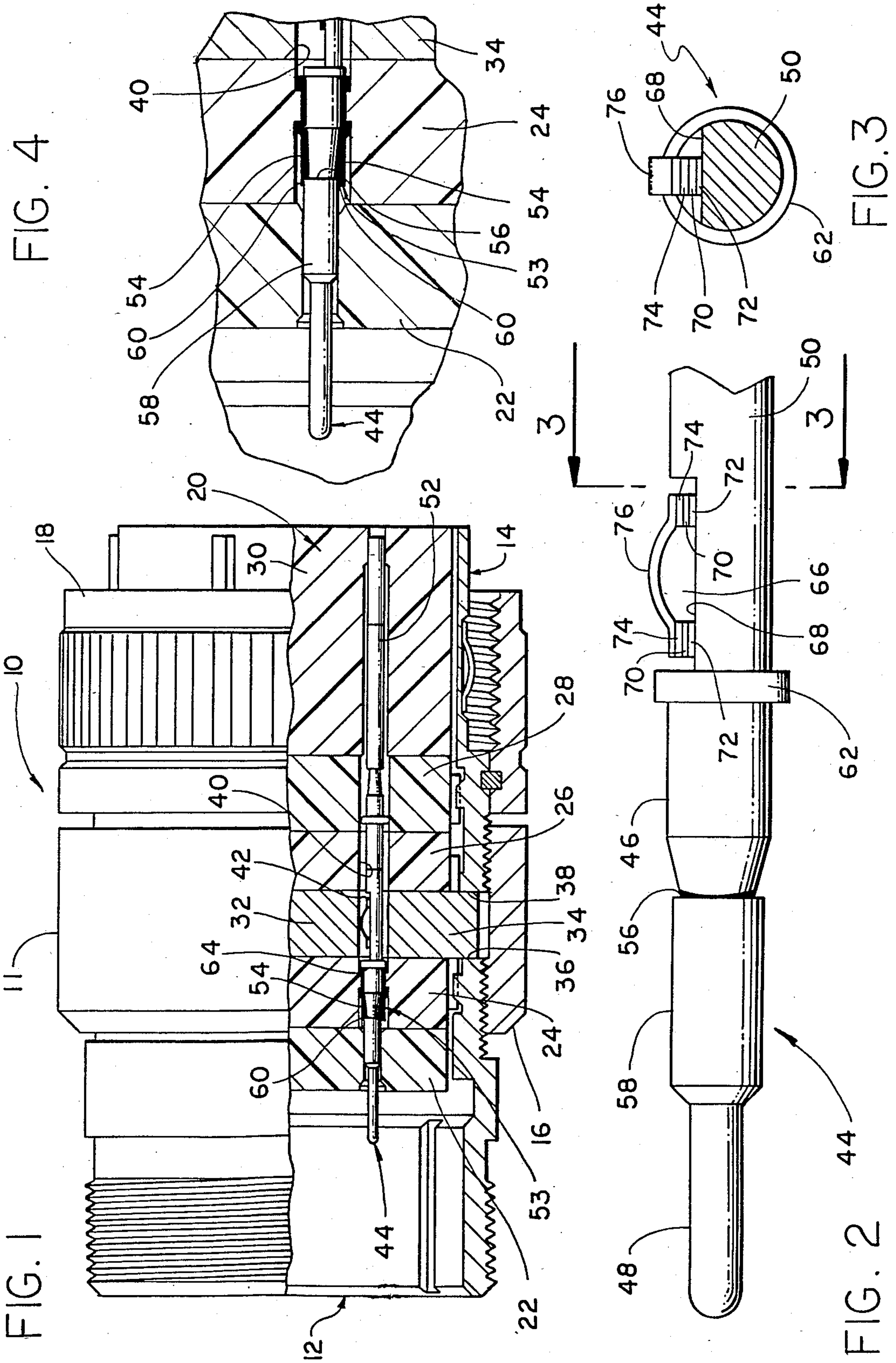
FIG. 1 is a partial longitudinal sectional view through a connector adapter embodying the present invention.
FIG. 2 is an enlarged side elevational view of the forward portion of the contact of the present invention showing how the electrical circuit components are mounted thereon.
FIG. 3 is a transverse sectional view taken along line 3—3 of FIG. 2.
FIG. 4 is an enlarged fragmentary longitudinal sectional view showing the contact retention system used in the connector illustrated in FIG. 1.
Figure 4:
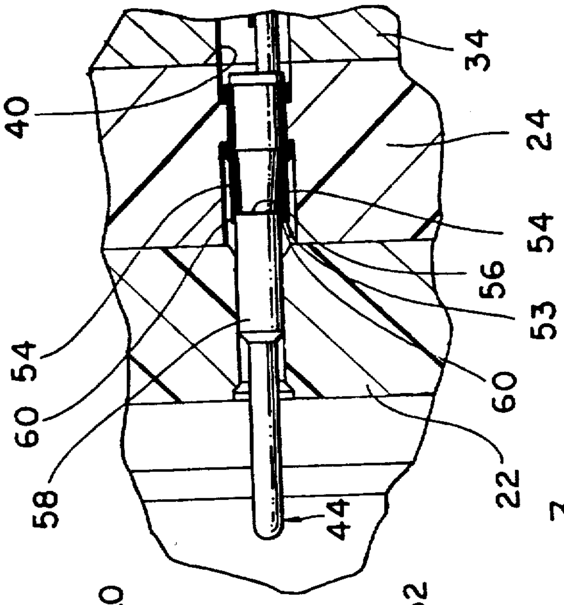
Figure 3:
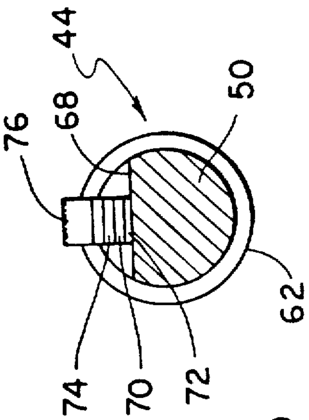
Figure 1:
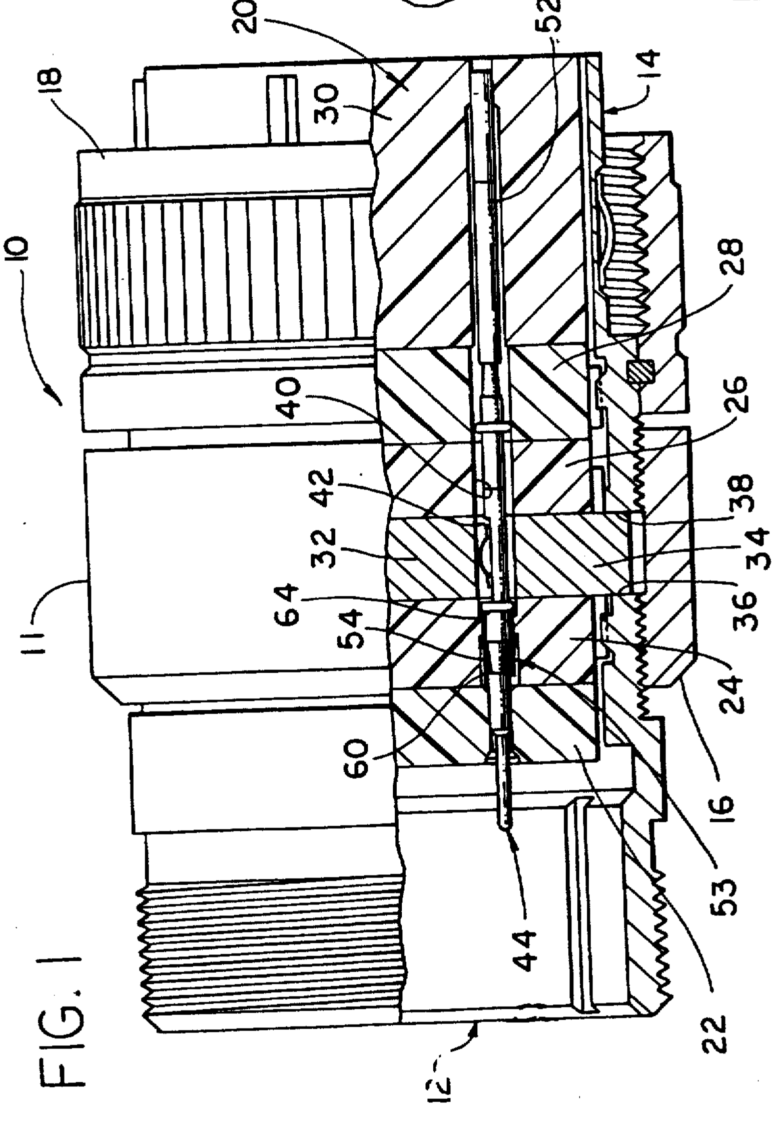
Figure 2:
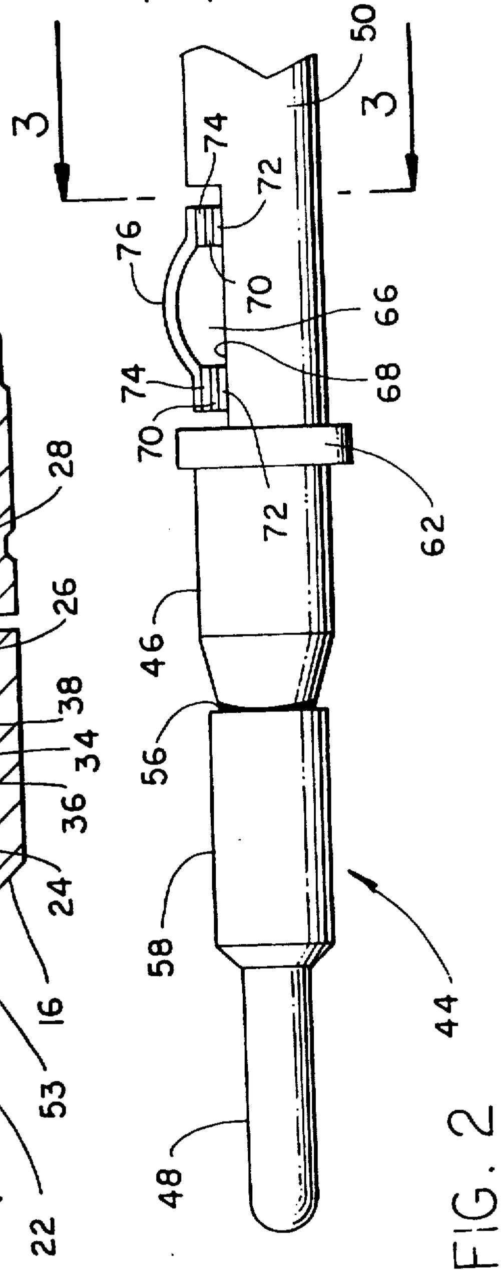

The present invention will be described herein as being incorporated in an electrical connector member in the form of an adapter which may be connected between the mating plug and receptacle halves of a connector assembly. However, it will be appreciated that the invention may be incorporated in either the plug half, or receptacle half of a connector.

The connector member adapter, generally designated 10, comprises a metallic housing 11 including a receptacle shell 12, a plug barrel 14 and a threaded connecting sleeve 16 which is threaded to the inner ends of the shell and barrel to hold the parts together. A coupling nut 18 is rotatably mounted on the barrel 14 for connecting the adapter 10 to a receptacle connector member, not shown. The shell 12 is adapted to engage a mating plug connector member, likewise not shown.

The housing 11 contains an insert or insulator assembly 20 comprising a front elastomeric insulator 22, a front hard insulator 24, two rear hard insulators 26 and 28, and a rear elastomeric insulator 30. A metal grounding plate 32 is disposed between the insulators 24 and 26. The outer periphery 34 of the grounding plate is positioned between the end faces 36 and 38 of the shell and barrel, respectively, so that when the connecting sleeve 16 is threaded to draw the shell and barrel together, the grounding plate will be trapped between the end faces 36 and 38 thereby providing an electrical connection between the grounding plate and the housing of the adapter.

A plurality of aligned openings extend through the insulators 22, 24, 26, 28 and 30 providing a contact passage 40. An opening 42 is formed in the grounding plate 32 coaxial with the passage 40. A contact, generally designated 44, is mounted in the contact passage 40, and extends through the opening 42 in the grounding plate. While only one such contact has been shown in the connector 10, it will be appreciated that the connector will contain a plurality of such contacts.

The contact 44 comprises a generally cylindrical contact body 46 having a forward mating end 48, shown in the form of a pin contact, an intermediate section 50 and a rear mating end 52 which is shown as being in the form of a socket contact. Thus, for the adapter 10 the contact is a double ended pin and socket contact. If the connector were in the form of either a plug or receptacle connector half, rather than an adapter, the rear end of the contact would be in the form of a solder pot, a crimp barrel, or the like.

As best seen in FIG. 4, the contact is removably mounted in the insert assembly 20 by means of a retention clip 53 which is fixedly mounted in the front hard insulator 24. The clip embodies forwardly and inwardly extending spring tines 54 which engage behind a shoulder 56 formed by an enlargement 58 on the forward portion of the contact body. The tines restrict rearward movement of the contact in the passage 40. The tines 54 embody release tabs 60 which may be engaged by a suitable cylindrical tool, not shown, that may be inserted through the forward end of the contact passage to spread the spring tines 54 outwardly away from the shoulder 56 on the contact so that the contact may be withdrawn rearwardly from the insert assembly 20, that is, in the right hand direction illustrated in FIG. 1. A collar 62 is formed on the contact body behind the enlargement 58. The collar engages a rearwardly facing shoulder 64 formed in the contact passage 50 within the front insulator 24 for restricting forward movement of the contact in the passage. This contact retention system is normally called a "front release" retention system which is well known in the art. It will be appreciated that other forms of contact retention arrangements may be utilized for removably mounting the contact 44 within the passage 40.

According to the invention, a notch 66 is formed in the intermediate section 50 of the contact in such a position that the notch will be generally aligned with the grounding plate 32 when the contact is mounted in the insert assembly 20.

The bottom 68 of the notch forms a flat supporting surface on which there may be mounted one or more electrical circuit components 70, two being shown in the drawings by way of example. The circuit components may be, for example, a bipolar diode for transient suppression and a capacitor for filtering. Each circuit component has a lower conductive layer 72 which is soldered to the supporting surface 68 of the contact, and an upper conductive layer 74. An outwardly bowed longitudinally extending leaf spring 76 is mounted with its ends resting upon the upper conductive layers 74 of the electrical components 70. The ends of the spring may be soldered to the layers 74. The leaf springs 76 provides electrical connection between the electrical circuit components 70 and the grounding plate 32 when the contact is mounted within the connector as shown in FIG. 1.

It will be appreciated that the diameter of the contact passage 40 behind the shoulder 64 therein, as well as the diameter of the opening 42 in the grounding plate 32, must be slightly greater than the diameter of the collar 62 on the contact body so that the contact may be freely slid into the contact passage from the rear. As a consequence, the bowed spring 76 must extend outwardly from the contact body beyond the diameter of the collar 62, so that the spring will resiliently engage the wall of the opening 42 in the grounding plate. Of course, the profile of the electrical circuit components 70 must be such that the components do not extend outwardly beyond the diameter of the collar 62 and preferrably are sufficiently small so as to not extend outside of the notch 66 in the contact body, as best seen in FIG. 3.

It will be appreciated that when the contact 44 is inserted into the passage 40, the spring 76 will be depressed inwardly so that when the contact reaches its final position in the insert assembly 20, as seen in FIG. 1, the spring will resiliently engage the wall of the opening 42 in the grounding plate 32 thereby providing an electrical connection between the electrical circuit components 70 and the metal housing 11 of the connector member 10.

The contact, with the electrical components 70 mounted on the side thereof, may be readily removed and replaced by use of a suitable release tool, as explained previously herein.

While the contact of the present invention has been described as having two electrical circuit components 70 mounted thereon, it will be appreciated that one of the circuit components may be replaced by a nonconductive block, such as nylon, which is bonded by a suitable cement to one end of the spring 76 and to the contact body so that the contact will carry only a single circuit component. The use of a nonconductive block in place of the second circuit component is desirable in order that the spring 76 will be supported in a like manner as when two circuit components are provided on the contact so that a uniform resilient electrical connecting force will be provided between the component and the grounding plate regardless whether one or two electrical circuit components are used. Of course, more than two such components may be mounted on the contact, if desired, and the components need not necessarily be mounted on the same side of the contact; however, additional connecting springs would be required in that case.

What is claimed is:

1. An electrical connector member comprising:
an electrical connector shell;
a grounding plate in said shell in electrical contact therewith;
an opening extending through said plate;
a contact mounted in said opening;
a transient signal suppressing diode electrical circuit component mounted on only one side of said contact and carried thereby; and
means making releasable electrical connection between said electrical component and said plate.

2. An electrical connector member as set forth in claim 1 including:
an insulator in said shell on one side of said plate;
said insulator having a passage therethrough aligned with said opening;
said contact extending through said passage; and
contact retention means in said passage releasably retaining said contact therein.

3. An electrical connector member as set forth in claim 1 wherein:
said electrical connection means comprises a spring element fixed to said electrical component.

4. An electrical connector member as set forth in claim 3 wherein:
said spring element comprises a longitudinally extending leaf spring.

5. An electrical connector member as set forth in claim 4 wherein:
said leaf spring is bowed outwardly from said contact.

6. An electrical connector member as set forth in claim 1 including:
a second electrical component mounted on said contact on the same side as said first mentioned electrical component and carried thereby.

7. An electrical connector member as set forth in claim 6 wherein:

said electrical connection means is also connected to said second electrical component.

8. An electrical connector member as set forth in claim 1 wherein:

said contact comprises a cylindrical contact body having a notch formed therein providing a supporting surface; and said electrical component is mounted on said supporting surface.

9. An electrical connector member as set forth in claim 8 wherein:

a pair of said electrical components is mounted on said supporting surface; and said electrical connection means comprises a spring fixed to both said electrical components.

10. An electrical connector member comprising:

an electrical connector shell;

a grounding plate in said shell in electrical contact therewith;

an opening extending through said plate;

a contact mounted in said opening;

a transient signal suppressing diode carried by said contact and non-concentrically mounted with respect to the center axis of said contact; and means making releasable electrical connection between said electrical component and said plate.

11. An electrical contact comprising:

a conductive contact body having a forward mating end, a rear termination or mating end and an intermediate section therebetween:

said intermediate section of said contact body having a flat supporting surface thereon; and a transient signal suppressing diode electrical circuit component mounted on only one side of said intermediate section of said contact body.

12. An electrical contact as set forth in claim 11 including:

an electrical connection spring element fixed to said electrical component and extending outwardly from said contact body.

13. An electrical contact as set forth in claim 12 wherein:

said spring element comprises a longitudinally extending leaf spring.

14. An electrical contact as set forth in claim 13 wherein:

said leaf spring is bowed outwardly from said contact body.

15. An electrical contact as set forth in claim 11 including:

a second electrical component mounted on said contact body on the same side as said first mentioned electrical component.

16. An electrical contact as set forth in claim 12 wherein:

a second electrical component is mounted on said contact body on the same side as said first-mentioned electrical component; and said electrical connection spring element is also connected to said second electrical component.

17. An electrical contact as set forth in claim 11 wherein:

said contact is cylindrical and has a notch formed therein providing said flat supporting surface; and said electrical circuit component is mounted on said supporting surface.

18. An electrical contact as set forth in claim 17 wherein:

a pair of said electrical circuit components are mounted on said flat supporting surface; and an outwardly bowed spring is fixed to both said electrical components.

19. An electrical connector member comprising:

an electrical connector shell;

an insulator in said shell having a passage extending therethrough;

a contact mounted in said passage;

said contact having a flat supporting surface thereon;

a transient signal supressing diode mounted on said supporting surface of said contact and carried by said contact;

said diode having opposed flat surfaces with planar conductive leads formed on said surfaces, one of said leads being adhered to said supporting surface; and means making releasable electrical connection between the other lead of said diode and said shell.

20. An electrical connector member as set forth in claim 14 including:

means releasably retaining said contact in said passage whereby said contact with said diode mounted thereon may be removed from said insulator without disassembly of the connector member.

21. An electrical connector member as set forth in claim 19 wherein:

said electrical connection means includes a ground plane extending tranversely across said shell.

22. An electrical connector member as set forth in claim 21 wherein:

said electrical connection means also includes a resilient conductive element extending between said other lead of said diode and said ground plane.

23. An electrical connector member comprising:

an electrical connector shell;

a ground plane extending across said shell and being in electrical contact therewith;

at least one opening in said plane;

a contact mounted through said opening;

a transient signal suppressing diode electrical circuit component mounted on only one side of said contact and carried thereby;

means making releasable electrical connection between said electrical component and said plane; and contact retention means releasably retaining said contact in said passage whereby said contact with said component mounted thereon may be removed from said shell without disassembly of the connector member.

24. An electrical connector member as set forth in claim 1 wherein:

said electrical component embodies spaced conductive leads.

* * * * *

UNITED STATES PATENT AND TRADEMARK OFFICE

CERTIFICATE OF CORRECTION

PATENT NO. : 4,600,262

DATED : July 15, 1986

INVENTOR(S) : Gerald R. Nieman, et al.

It is certified that error appears in the above-identified patent and that said Letters Patent is hereby corrected as shown below:

Column 6, line 27, "claim 14" should read - - "claim 19".

Signed and Sealed this

Ninth Day of June, 1992

*Attest:*

DOUGLAS B. COMER

*Attesting Officer*

*Acting Commissioner of Patents and Trademarks*

REEXAMINATION CERTIFICATE (1511th)

United States Patent [19] [11] B1 4,600,262

Nieman et al. [45] Certificate Issued Jul. 16, 1991

[54] ELECTRICAL CONNECTOR EMBODYING ELECTRICAL CIRCUIT COMPONENTS

[75] Inventors: Gerald R. Nieman; James E. Thompson, both of Phoenix; William D. Couper, Tempe; Clarence L. Clyatt, III, Phoenix, all of Ariz.

[73] Assignee: ITT Corp, New York, N.Y.

Reexamination Request:
No. 90/002,186, Oct. 31, 1990

Reexamination Certificate for:

| | |
|---|---|
| Patent No.: | **4,600,262** |
| Issued: | **Jul. 15, 1986** |
| Appl. No.: | **480,169** |
| Filed: | **Mar. 29, 1983** |

[51] Int. Cl.$^5$ .................... H03H 7/00; H01R 3/00
[52] U.S. Cl. .................... 439/608; 333/182; 439/620
[58] Field of Search .................... 439/620, 608; 333/181-185; 361/111, 118, 119, 129

[56] References Cited

U.S. PATENT DOCUMENTS

| | | | |
|---|---|---|---|
| 3,388,590 | 6/1968 | Dryden | 73/88.5 |
| 3,558,994 | 4/1969 | Bernstein | 317/101 |
| 3,569,915 | 3/1971 | Sorenson | 339/143 |
| 4,199,736 | 4/1980 | McTaggart et al. | 333/17L |
| 4,328,523 | 5/1982 | Seguin | 361/56 |
| 4,509,090 | 4/1985 | Kawanami et al. | 361/119 |
| 4,920,443 | 4/1990 | Shepherd | 361/111 |

*Primary Examiner*—Gary F. Paumen

[57] ABSTRACT

An electrical connector containing removable contacts upon which there are mounted electrical circuit components. One or more such components may be mounted on the side of each contact body. A spring provides electrical connection between the components and the grounding plate in the connector containing openings into which the contacts are removably mounted.

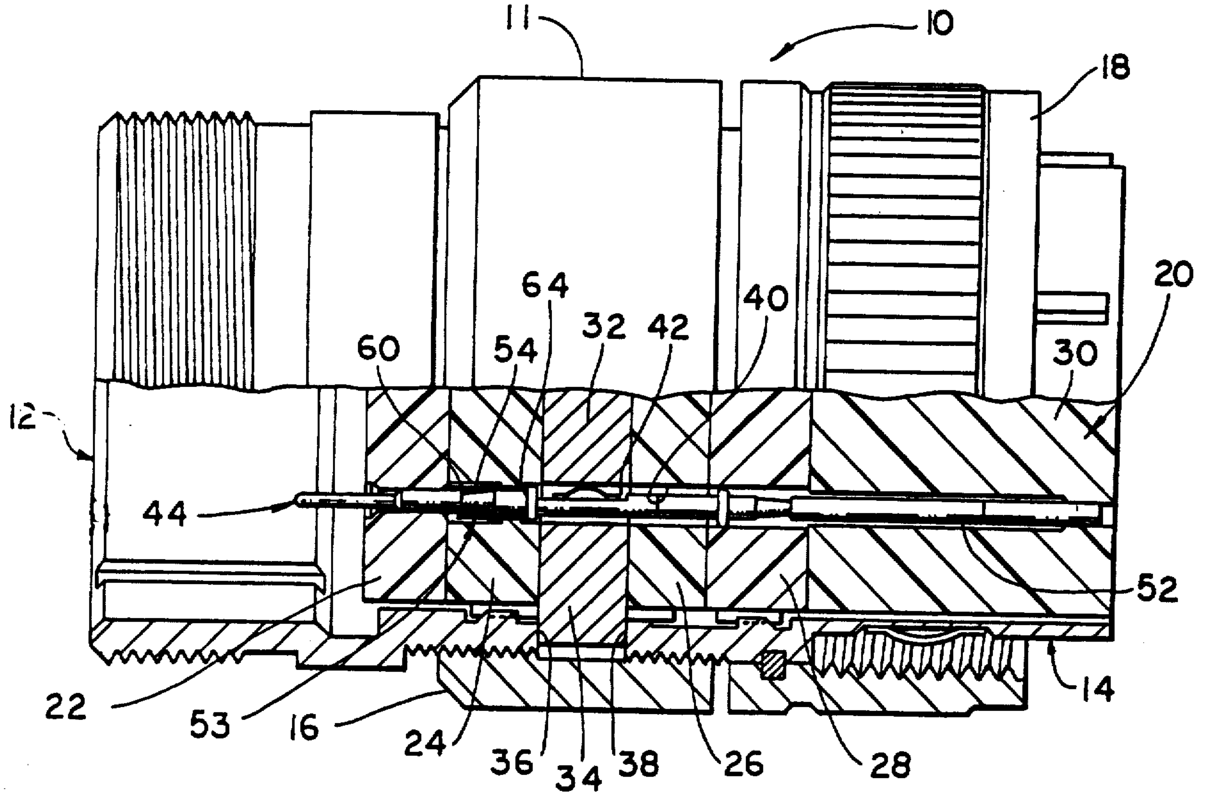

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-10, 12-19, 21, 22, and 24 is confirmed.

Claim 11 is cancelled.

Claims 20, and 23 are determined to be patentable as amended.

New claims 25-31 are added and determined to be patentable.

20. An electrical connector member as set forth in claim [14] *19* including:
- means releasably retaining said contact in said passage whereby said contact with said diode mounted thereon may be removed from said insulator without disassembly of the connector member.

23. An electrical connector member comprising:
- an electrical connector shell;
- a ground plane extending across said shell and being in electrical contact therewith;
- at least one opening in said plane;
- a contact mounted through said opening;
- a transient signal suppressing diode electrical circuit component mounted on only one side of said contact and carried thereby;
- means making releasable electrical connection between said electrical component and said plane; and
- contact retention means releasably retaining said contact in said [passage] *opening* whereby said contact with said component mounted thereon may be removed from said shell without disassembly of the connector member.

*25. An electrical connector member as set forth in claim 1, wherein:*
- *said diode is bonded to said contact, and including means releasably retaining said contact in said opening whereby said contact with said diode mounted thereon may be removed from said shell.*

*26. An electrical connector member as set forth in claim 19, including:*
- *means releasably retaining said contact in said shell whereby said contact with said diode mounted thereon may be removed from said shell.*

*27. An electrical connector member as set forth in claim 19 wherein:*
- *said means making releasable electrical connection includes a ground plane extending across said shell and having an opening therein removably receiving said contact therein;*
- and said electrical connector member further including means releasably retaining said contact in said opening whereby said contact with said diode mounted thereon may be removed from said shell.

*28. An electrical connector member comprising:*
- *an electrical connector shell;*
- *an insulator in said shell having a passage extending therethrough;*
- *a ground plane extending across said shell and being in electrical contact therewith, said ground plane having an opening therein aligned with said passage;*
- *a contact mounted in said opening and said passage;*
- *said contact having a generally cylindrical mounting portion and a recess formed in said mounting portion providing a flat supporting surface;*
- *a transient signal-suppressing diode mounted on said supporting surface and carried by said contact;*
- *said diode having opposed flat surfaces with planar conductive leads formed on said surfaces, one of said leads being adhered to said supporting surface;*
- *means making releasable electrical connection between the other lead of said diode and said ground plane; and*
- *means releasably retaining said contact in said shell whereby said contact with said diode mounted thereon may be removed from said shell.*

*29. An electrical contact comprising:*
- *a conductive contact body having a forward mating end, a rear termination or mating end, and an intermediate section therebetween;*
- *said intermediate section of said contact body having a recess providing a flat supporting surface;*
- *a transient signal-*suppressing diode mounted on said supporting surface and carried by said contact body on only one side thereof; and
- *said diode having opposed flat surfaces with planar conductive leads formed on said surfaces, one of said leads being adhered to said supporting surface so at least part of the diode lies in said recess.*

*30. An electrical contact comprising:*
- *a conductive contact body having a forward mating end, a rear termination or mating end, and an intermediate section therebetween:*
- *a recess in said intermediate section providing a flat supporting surface;*
- a transient signal-*suppressing diode mounted on said supporting surface and carried by said contact body to lie on only one side of said body; and*
- *the depth of said recess being sufficient that the cross-section of said diode and contact body at said supporting surface is no greater than the maximum cross-section of the contact, to thereby permit a high density arrangement of said contact with other contacts in an electrical connector.*

*31. An electrical contact comprising:*
- *a conductive contact body having a forward mating end, a rear termination or mating end and an intermediate section therebetween;*
- *said intermediate section of said contact body having a substantially cylindrical portion with a recess forming a flat supporting surface; and*
- *a transient signal suppressing diode electrical circuit component mounted on only one side of said intermediate section of said contact body on said flat supporting surface formed by said recess.*

* * * * *